United States Patent
Ha et al.

(10) Patent No.: US 9,648,768 B2
(45) Date of Patent: May 9, 2017

(54) DISPLAY DEVICE HAVING A BOTTOM CHASSIS INCLUDING A BINDING PORTION

(71) Applicant: SAMSUNG DISPLAY CO., LTD., Yongin, Gyeonggi-Do (KR)

(72) Inventors: Seung Hwa Ha, Gyeonggi-do (KR); Chang Moo Lee, Gyeonggi-do (KR); Joo Young Kim, Gyeonggi-do (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 62 days.

(21) Appl. No.: 14/617,053

(22) Filed: Feb. 9, 2015

(65) Prior Publication Data
US 2016/0021774 A1 Jan. 21, 2016

(30) Foreign Application Priority Data
Jul. 18, 2014 (KR) .................. 10-2014-0090799

(51) Int. Cl.
*G02F 1/1333* (2006.01)
*G02F 1/1335* (2006.01)
*H05K 7/02* (2006.01)

(52) U.S. Cl.
CPC ......... *H05K 7/02* (2013.01); *G02F 1/133308* (2013.01); *G02F 1/133615* (2013.01); *G02F 2001/13332* (2013.01); *G02F 2001/133314* (2013.01); *G02F 2001/133317* (2013.01)

(58) Field of Classification Search
CPC ........ G02F 2001/133314; G02F 2001/133317; G02F 1/133308
See application file for complete search history.

(56) References Cited

U.S. PATENT DOCUMENTS

| | | | | |
|---|---|---|---|---|
| 2004/0246397 A1* | 12/2004 | Kang | ................ | G02F 1/133308 349/58 |
| 2005/0041411 A1* | 2/2005 | Wu | ................... | G02F 1/133608 362/633 |
| 2009/0153767 A1* | 6/2009 | Bae | ...................... | G02B 6/0055 349/58 |
| 2011/0109842 A1* | 5/2011 | Furusawa | ......... | G02F 1/133604 349/64 |
| 2011/0255026 A1* | 10/2011 | Pan | ...................... | G02B 6/0088 349/61 |
| 2013/0003268 A1 | 1/2013 | Cheon | | |

FOREIGN PATENT DOCUMENTS

| | | |
|---|---|---|
| KR | 1020070051981 | 5/2007 |
| KR | 10-0759673 | 9/2007 |
| KR | 10-0759674 | 9/2007 |
| KR | 10-0759675 | 9/2007 |
| KR | 1020090036642 | 4/2009 |
| KR | 1020130007144 | 1/2013 |

* cited by examiner

*Primary Examiner* — Wen-Ying P Chen
(74) *Attorney, Agent, or Firm* — F. Chau & Associates, LLC

(57) ABSTRACT

A display device includes a display panel, and a light source configured to emit light onto the display panel. The display panel includes a bottom chassis including a binding portion. The display panel and the light source are disposed in the bottom chassis. The binding portion is configured to control a position of the display panel in the bottom chassis. The display device includes a mold frame configured to control a position of the bottom chassis disposed on the mold frame. The mold frame includes a binding groove aligned with the binding portion of the bottom chassis.

16 Claims, 10 Drawing Sheets

DISPLAY DEVICE HAVING A BOTTOM CHASSIS INCLUDING A BINDING PORTION

CROSS-REFERENCE TO RELATED APPLICATION

This application claims priority under 35 U.S.C. §119 to Korean Patent Application No. 10-2014-0090799, filed on Jul. 18, 2014, in the Korean Intellectual Property Office, the disclosure of which is incorporated by reference herein in its entirety.

TECHNICAL FIELD

Exemplary embodiments of the present inventive concept relate to a display device, and more particularly to a display device including a bottom chassis including a binding portion.

DISCUSSION OF RELATED ART

A liquid crystal display (LCD) may include a flat panel display (FPD) including a liquid crystal layer disposed between two substrates having electrodes, and liquid crystal molecules of the liquid crystal layer may be rearranged upon applying a voltage to the electrodes to adjust the amount of transmitted light.

An LCD may include a display panel displaying an image and may include a backlight assembly supplying light to the display panel. The backlight assembly may be a direct type, an edge type, or a corner type.

A bezel width of a display device may be reduced to achieve a slim bezel. With the slim bezel, there might not be enough space to receive a display panel and an optical sheet, and thus strength of the display device may be decreased.

SUMMARY

Exemplary embodiments of the present inventive concept are directed toward a display device that includes a bottom chassis including a binding part configured to control a position of a display panel and that includes a mold frame configured to control a position of an exterior surface of the bottom chassis and having a binding groove aligned with the binding part.

According to an exemplary embodiment of the present inventive concept, a display device includes a display panel, and a light source configured to emit light onto the display panel. The display device includes a bottom chassis which includes a binding portion. The display panel and the light source are disposed in the bottom chassis. The binding portion is configured to control a position of the display panel in the bottom chassis. The display device includes a mold frame which is configured to control a position of the bottom chassis disposed on the mold frame. The mold frame comprises a binding groove aligned with the binding portion of the bottom chassis The bottom chassis may include a base portion and a sidewall that extends in a direction perpendicular to a surface of the base portion.

The binding portion may include a panel seating part that extends from the sidewall of the bottom chassis. The panel seating party may be substrantially parallel to the base portion of the bottom chassis. The binding portion may include a stopper portion that extends from the panel seating part.

The panel seating part may be disposed in the binding groove.

The stopper portion may have a curved shape.

The display device may include a light guide plate configured to guide light emitted from the light source therethrough. The display deviced may include an optical sheet configured to condense the light emitted from the light guide plate and to transmit the condensed light to the display panel.

The sidewall of the bottom chassis may a height greater than or equal to the total height of the light guide plate and the optical sheet.

The display device may include a diffusion plate configured to diffuse the light emitted from the light source and may include an optical sheet configured to condense the light diffused by the diffusion plate and to transmit the condensed light to the display panel.

The display device may include a supporter configured to support the diffusion plate and disposed on the base portion of the bottom chassis.

The sidewall of the bottom chassis may have a height greater than or equal to the total height of the diffusion plate, the supporter, and the optical sheet.

The mold frame may have an opening in its central portion.

The base portion and sidewall of the bottom chassis may be disposed in the opening.

The display device may include an optical sheet that is disposed between the bottom chassis and the display panel and that includes a sheet body and a sheet guide part protruding outwards from the sheet body.

The mold frame may have an insertion groove and the sheet guide part may be disposed in the insertion groove.

The sheet guide part may be disposed in the bottom chassis. The bottom chassis may include a guide insertion groove in a location corresponding to the insertion groove.

According to exemplary embodiments of the present inventive concept, a display device may stably support a display panel and an optical sheet. The display device may include a mold frame configured to restrict where an exterior surface of a bottom chassis is located, and a thin display device may be achieved and the strength of the display device may be improved.

The foregoing is illustrative only and is not intended to be in any way limiting to exemplary embodiments of the present inventive concept.

BRIEF DESCRIPTION OF THE DRAWINGS

A more complete appreciation of the present inventive concept will become more apparent by describing in detail exemplary embodiments thereof with reference to the accompanying drawings.

DETAILED DESCRIPTION

Figure 1:
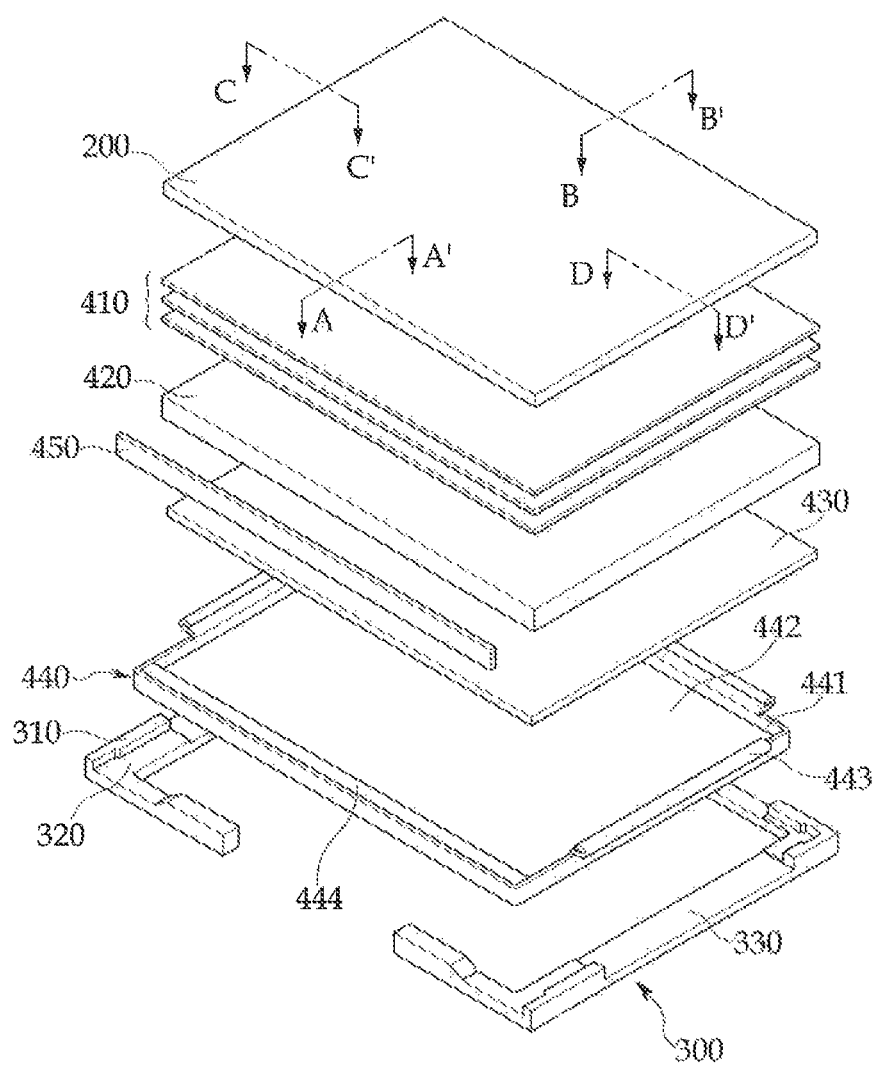
FIG. 1 is an exploded perspective view of a display device according to an exemplary embodiment of the present inventive concept.

Aspects of the present inventive concept will be described in more detail below with reference to the accompanying drawings. The inventive concept may, however, be embodied in many different forms and should not be construed as being limited to the embodiments set forth herein. Like reference numerals may refer to like elements throughout the specification and drawings.

It will be understood that the spatially relative terms may encompass different orientations of the device in use or operation, in addition to the orientation depicted in the drawings.

Hereinafter, a display device according to an exemplary embodiment of the present inventive concept will be described with reference to FIGS. 1 to 7.

Figure 2:
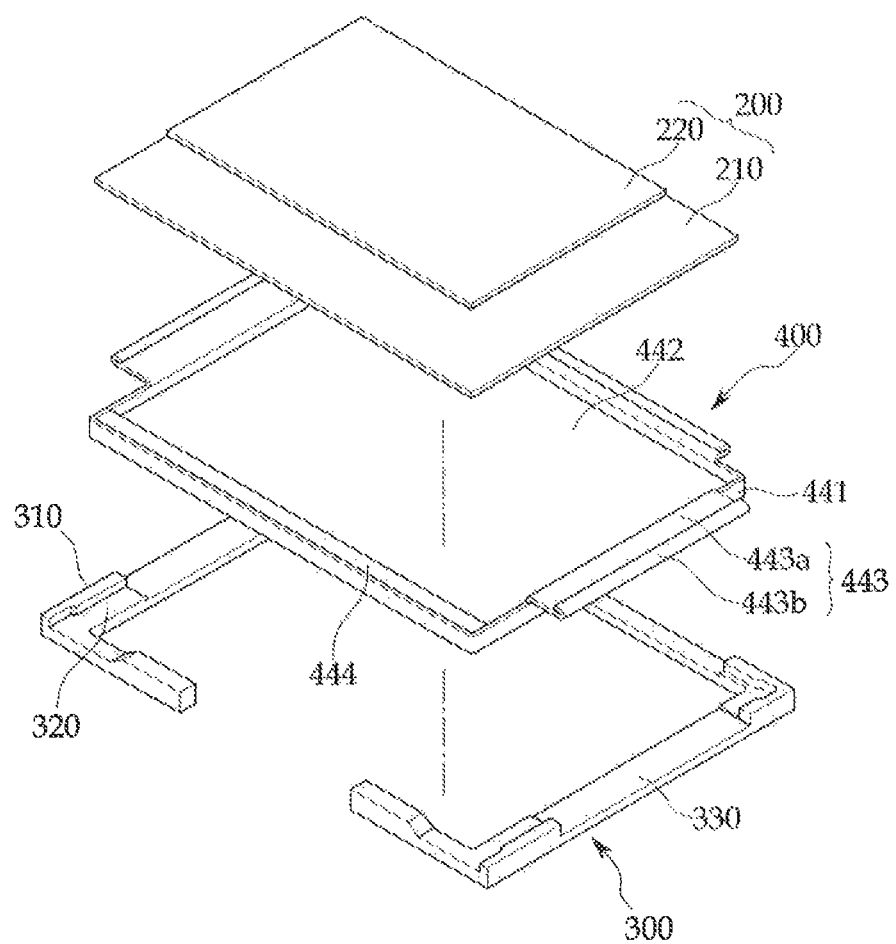
FIG. 2 is an exploded perspective view of a bottom chassis and mold frame, on which a display panel is disposed.
Figure 3:
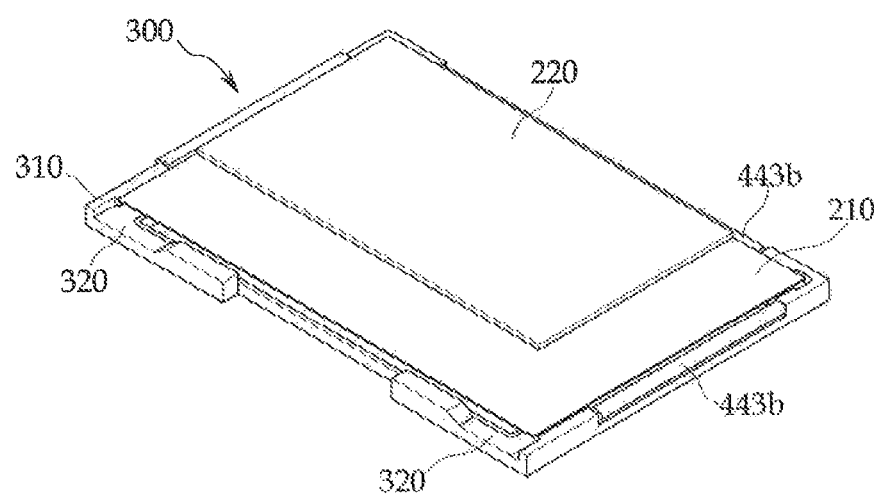
FIG. 3 is a coupled perspective view of a bottom chassis and mold frame, on which a display panel is disposed.

FIG. 1 is an exploded perspective view of a display device according to an exemplary embodiment of the present inventive concept. FIG. 2 is an exploded perspective view of a bottom chassis and mold frame, on which a display panel is disposed. FIG. 3 is a coupled perspective view of a bottom chassis and mold frame on which a display panel is disposed.

Referring to FIGS. 1 to 3, a display device may include a display panel 200 configured to display an image, a backlight assembly 400 configured to emit light to the display panel 200, and a mold frame 300 coupled to the backlight assembly 400.

The display panel 200 may display an image. The display panel 200 may include a liquid crystal display (LCD) panel, an electrowetting display panel, an electrophoretic display panel, or a microelectromechanical systems (MEMS)-based display panel. According to an exemplary embodiment of the present inventive concept, the display panel 200 may be the LCD panel.

The display panel 200 may be shaped like quadrangular plates that have two pairs of parallel sides. According to an exemplary embodiment of the present inventive concept, the display panel 200 may have a rectangular shape that has two long sides and two short sides. The display panel 200 may include a first substrate 210, a second substrate 220 facing the first substrate 210, and a liquid crystal layer (not shown) between the first and second substrates 210 and 220. The display panel 200 may include a display area that displays an image and a non-display area that surrounds the display area and that does not display an image when viewed from the top.

The first substrate 210 may include a plurality of pixel electrodes (not shown) and a plurality of thin film transistors (TFTs; not shown) that may be electrically connected and may correspond in one-to-one relationships with the pixel electrodes. Each TFT may provide drive signals to its corresponding pixel electrode. The second substrate 220 may include a common electrode (not shown) that generates an electric field controlling arrangements of liquid crystal molecules, in conjunction with the pixel electrodes. The display panel 200 may include a liquid crystal layer that projects an image forwards.

The display panel 200 may include a driver chip (not shown) configured to supply drive signals, a tape carrier package (TCP) in which the driver chip is mounted, and a printed circuit board (PCB; not shown) electrically connected to the display panel 200 through the TCP.

Figure 4:
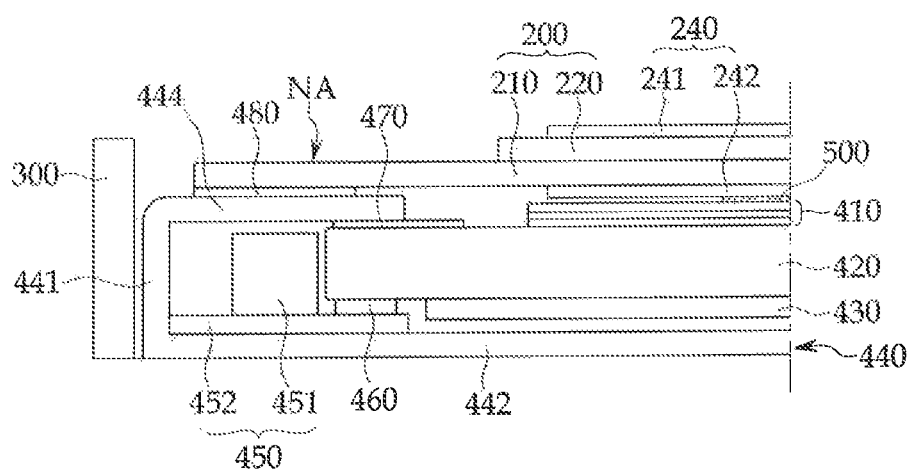
FIG. 4 is a cross-sectional view taken along line A-A' of FIG. 1.
Figure 7:
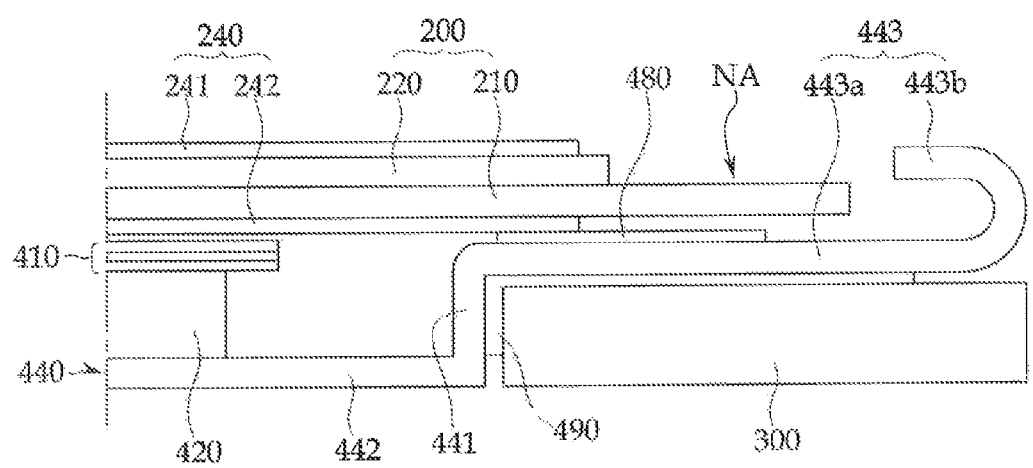
FIG. 7 is a cross-sectional view taken along line D-D' of FIG. 1.

The driver chip and the TCP may be disposed in a pad area (NA) of the display panel 200, as illustrated in FIGS. 2, 4, and 7.

The driver chip may produce drive signals to drive the display panel 200 in response to external signals. The external signals may be supplied from the PCB and may include image signals, control signals, and drive voltages.

A polarizer 240 may be disposed on the display panel 200 and may include a first polarizer 241 and a second polarizer 242. The first and second polarizers 241 and 242 may be respectively disposed on opposite surfaces of the first and second substrates 210 and 220. The first polarizer 241 may be disposed on an exterior of the first substrate 210 and the second polarizer 242 may be disposed on the exterior of the second substrate 220. The transmission axis of the first polarizer 241 may be substantially orthogonal to the transmission axis of the second polarizer 242.

The mold frame 300 may be coupled to a bottom chassis 440. The mold frame 300 may be coupled to the display panel 200 at a corner part 320 of the mold frame 300. The mold frame 300 may include a flexible material, such as plastic, and may reduce or prevent damage to the display panel 200.

The backlight assembly 400 may include an optical sheet 410, a light guide plate 420, a reflective sheet 430, the bottom chassis 440, a light source module 450, and tapes 350, 460, 480, and 490.

The light source module 450 may include a light source 451 and a circuit board 452 on which the light source 451 is disposed. The light source module 450 may be disposed at an edge portion of the light guide plate 420 or on a light incident surface thereof. The light source module 450 may emit light to the edge portion or light incident surface of the light guide plate 420.

The light source 451 may include at least one light emitting diode (LED) chip (not shown) and a package (not shown) configured to accommodate the LED chip. The light source 451 may include a light emitting surface facing a direction in which the light guide plate 420 is disposed.

The circuit board 452 may be, for example, a printed circuit board (PCB) or a metal core PCB.

The light source module 450 may be disposed on one side surface, two side surfaces, or all four side surfaces of the light guide plate 420, or may be disposed on at least one edge portion of the light guide plate 420, according to the size or luminance uniformity of the display panel 200.

Light emitted from the light source 451 may be emitted onto the light incident side of the light guide plate 420 and light may be emitted to a light emitting surface of the light guide plate 420. The light guide plate 420 may guide light received from the light source module 450 to the display panel 200. The light guide plate 420 may be disposed in the vicinity of the light source module 450 and may be disposed in the bottom chassis 440. The light guide plate 420 may have a quadrangular plate shape and may have substantially the same shape as the display panel 200 (e.g. an LCD panel), but exemplary embodiments of the present inventive concept are not limited thereto. When using an LED light source, the light guide plate 420 may have various shapes including predetermined grooves or protrusions according to the position of the light source 451.

The light guide plate 420 may be a plate, and the light guide plate 420 may be a sheet or a film, for example, in a relatively slim display device.

The light guide plate 420 may include a light-transmissive material, e.g., an acrylic resin such as polymethylmethacrylate (PMMA) or polycarbonate (PC).

A pattern may be formed on at least one surface of the light guide plate 420. For example, a lower surface of the light guide plate 420 may include a scattering pattern (not shown) configured to emit light in an upwards direction.

The optical sheet 410 may be disposed on the light guide plate 420, and may diffuse and collimate light transmitted from the light guide plate 420. The optical sheet 410 may include a diffusion sheet, a prism sheet, and a protective sheet. The diffusion sheet may diffuse light transmitted from the light guide plate 420 and may reduce or prevent the light from being concentrated. The prism sheet may have triangular prisms on a surface thereof in a predetermined arrangement. The prism sheet may be disposed on the diffusion and may collimate light diffused from the diffusion sheet in a direction perpendicular to the display panel 200. The protective sheet may be disposed on the prism sheet, may protect a surface of the prism sheet and may diffuse light. The diffused light may be equally distributed light.

The reflective sheet 430 may be disposed between the light guide plate 420 and the bottom chassis 440, and light emitted downwards from the light guide plate 420 may be reflected towards the display panel 200, thereby increasing light efficiency.

The reflective sheet 430 may include, for example, polyethylene terephthalate (PET). PET may impart reflective properties. A surface of the reflective sheet 430 may be coated with a diffusion layer including, for example, titanium dioxide.

The reflective sheet 430 may include a material containing a metal such as silver (Ag).

The reflective sheet 430, the light guide plate 420, and the optical sheet 410 may be disposed in the bottom chassis 440. The bottom chassis 440 may include a base portion 442 that is parallel to the light guide plate 420. The bottom chassis 440 may include a hard metal material such as stainless steel or a heat dissipating material such as aluminum or an aluminum alloy. According to an exemplary embodiment of the present inventive concept, the bottom chassis 440 may be configured to maintain a shape of the display device and to protect a variety of components disposed in the bottom chassis 440.

A coupling structure may secure a surface on which the display panel 200 and the optical sheet 410 are disposed and may increase strength of a display device. The coupling structure may couple the bottom chassis 440 to the mold frame 300 and will be described below in more detail with reference to FIGS. 1 to 7.

Figure 5:
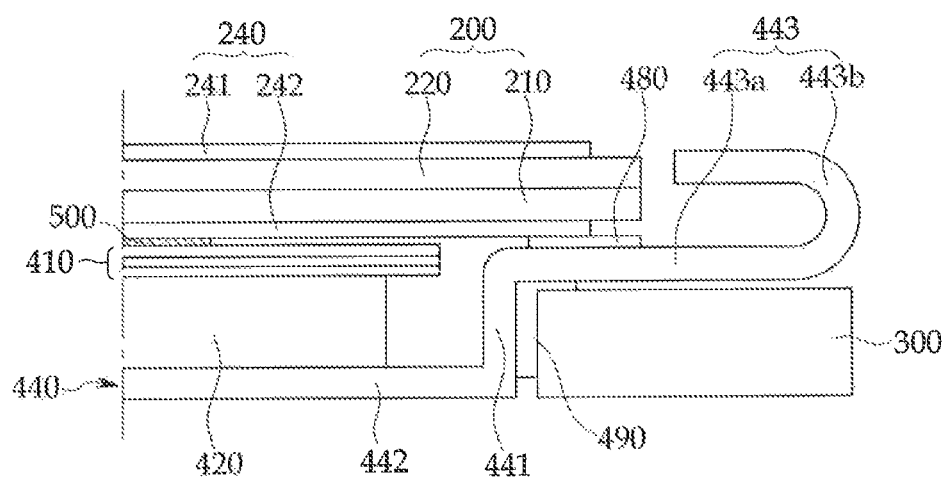
FIG. 5 is a cross-sectional view taken along line B-B' of FIG. 1.
Figure 6:
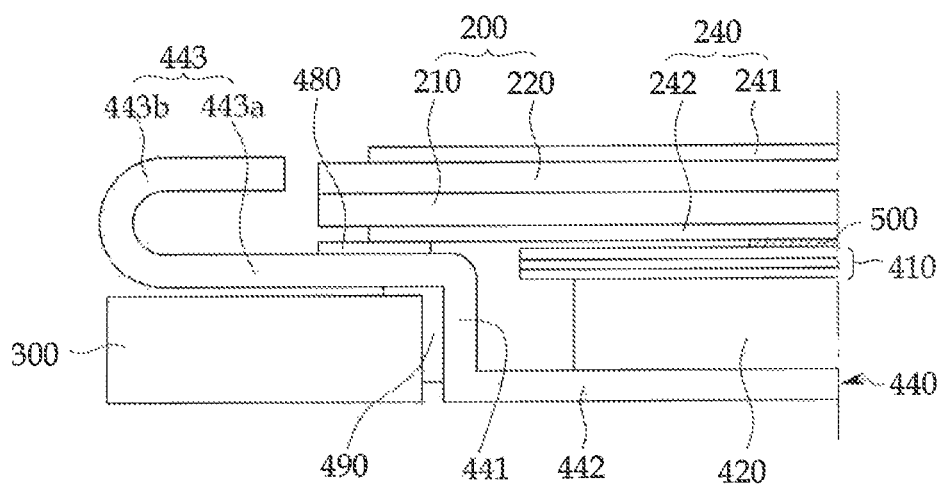
FIG. 6 is a cross-sectional view taken along line C-C' of FIG. 1.

FIG. 4 is a cross-sectional view taken along line A-A' of FIG. 1. FIG. 5 is a cross-sectional view taken along line B-B' of FIG. 1. FIG. 6 is a cross-sectional view taken along line C-C' of FIG. 1. FIG. 7 is a cross-sectional view taken along line D-D' of FIG. 1.

Referring to FIGS. 1 to 7, the display device according to an exemplary embodiment of the present inventive concept may include the mold frame 300 coupled to the bottom chassis 440 outside the bottom chassis 440 and may include the bottom chassis 440.

The bottom chassis 440 may include the base portion 442, a sidewall 441 vertically extending from a surface of the base portion 442, a binding portion 443 configured to substantially fix a position of a display panel 200, and a panel supporting portion 444. A light source 451 may be disposed in the bottom chassis 440.

The base portion 442 and the sidewall 441 may be disposed in an opening in a central portion of the mold frame 300, as illustrated in FIGS. 2 and 3.

The binding portion 443 may include a panel seating part 443a and a stopper part 443b.

The binding portion 443 may be disposed on at least one of four sidewalls 441 of the bottom chassis 440. When the light source 451 includes an edge-type backlight unit that is disposed at an edge portion, the binding portion 443 may be disposed on the sidewalls 441 where the light source 451 is not disposed. For example, as illustrated in FIGS. 1 and 4, the binding portion 443 need not be disposed on the sidewall 441 of the bottom chassis 440 on which the light source 451 is disposed. The panel supporting portion 444 which may be bent and may extend at the sidewall 441 may be disposed on the sidewall 441 of the bottom chassis 441 on which the light source 451 is not disposed. When a direct-type backlight unit is included in the display device, the binding portion 443 may be disposed on all of the four sidewalls 441 of the bottom chassis 440.

The panel seating part 443a may extend from the sidewall 441 of the bottom chassis 440 and may be substantially parallel to the base portion 442 of the bottom chassis 440. The panel seating part 443a may extend outwards from the base portion 442 of the bottom chassis 440. The panel seating part 443a may be disposed with the display panel 200 and may be disposed in a binding groove of the mold frame 300.

The stopper part 443b may extend from the panel seating part 443a. The stopper part 443b may have a curved shape. The binding portion 443 including the curved stopper part 443b may have increased strength.

The panel supporting portion 444 may extend from the sidewall 441 of the bottom chassis 440 and may be substantially parallel to the base portion 442 of the bottom chassis 440. The panel supporting portion 444 may extend towards a central portion of the base portion 442 of the bottom chassis 440. The panel supporting portion 444 may have a "C" shaped cross-section as illustrated in FIGS. 1 and 4. The panel supporting portion 444 may be disposed over the light source 451 as illustrated in FIG. 4. The panel supporting portion 444 may reflect light emitted from the light source 451.

When the light source 451 includes the edge-type backlight unit, the panel supporting portion 444 may extend from the sidewall 441 of the bottom chassis 440 where the light source 451 is disposed. When the light source 451 includes the direct-type backlight unit, the binding portion 443 may be disposed on all of the four sidewalls of the bottom chassis 440.

The mold frame 300 may have an opening in its central portion. According to an exemplary embodiment of the present inventive concept, the mold frame 300 may have a partially rectangular shape with an open side as illustrated in FIG. 2. The mold frame 300 may include a sidewall part 310, a corner part 320, and a binding groove 330.

The sidewall part 310 may be in contact with an exterior surface of the display panel 200 at an edge portion of the mold frame 300. For example, the sidewall part 310 may be in contact with the exterior surface of the display panel 200 and may reduce or prevent movement of the display panel 200. The sidewall part 310 may have an opening in a region corresponding to the sidewall 441 on which the panel supporting portion 444 is disposed.

The corner part 320 may be disposed at a corner portion of the mold frame 300 and may guide the display panel 200. For example, the corner part 320 may be disposed at a corner area of the display panel 200, in which each of four edges of the display panel 200 meets, and may reduce or prevent movement of the display panel 200.

The binding groove 330 may control a position of an exterior surface of the bottom chassis 440. The binding portion 443 may be disposed in the binding groove 330. The binding groove 330 may be disposed in the mold frame 300, may be shaped to correspond to the binding portion 443, and may be lower in height than the corner part 320. As illustrated in FIGS. 1 and 2, for example, the corner part 320 and the binding groove 330 may have different heights from each other.

Hereinafter, an internal structure of a display device including the bottom chassis 440 and the mold frame 300 according to an exemplary embodiment of the present inventive concept will be described in more detail with reference to FIGS. 1 and 4 to 7.

In FIG. 1, a region in which the light source 451 is disposed and which is marked with line A-A' may be referred to as a light-incident portion. In FIG. 1, a region facing where the light source 451 is disposed and which is marked with line B-B' is may be referred to as a light-facing portion. In FIG. 1, a region which is on the left side of the light source 451 and which is marked with line C-C' may be referred to as a left side portion. In FIG. 1, a region which is on the right side of the light source 451 and which is marked with line D-D' may be referred to as a right side portion.

Referring to FIGS. 1 and 4, the light source 451 and the panel supporting portion 444 may be disposed in the light-incident portion. The light source 451 may be disposed on the circuit board 451. The light source module 450 may be disposed under the panel supporting portion 444 and may be disposed at an edge portion of the bottom chassis 440. The light guide plate 420 and the optical sheet 410 may be disposed in the bottom chassis 440. An end portion of the display panel 200 may be disposed on the panel supporting portion 444 and on the optical sheet 410. A display panel 200 region that overlaps the panel supporting portion 444 may be the pad area NA in which the driver chip is disposed. The tapes 460 and 480 may fix the light guide plate 420 to the circuit board 452 and may fix the display panel 200 to the panel supporting portion 444. A reflective tape 470 may be adhesive and a light reflecting material may be disposed on one surface of the reflective tape 470. The reflective tape 470 may reflect light emitted from the light source 451 to the light guide plate 420. An adhesive member 500 may bond the display panel 200 to the optical sheet 410. The adhesive member 500 may include a pressure sensitive adhesive (PSA). The PSA may be a substance that bonds two surfaces to each other by bonding or attraction between molecules, atoms, or ions, or adsorption thereof. The PSA may include a transparent adhesive which has a low elastic modulus and high flexibility.

Hereinafter, descriptions of the light-facing portion, left side portion, and right side portion illustrated in FIGS. 5 to 7, which are consistent with the description of the ht-incident portion, may be omitted.

Referring to FIG. 5, the binding portion 443 may be disposed in the light-facing portion. The mold frame 300 may be coupled to the bottom chassis 440 with the tape 490 disposed therebetween. An end portion of the display panel 200 may be disposed on the panel seating part 443a of the binding portion 443 and on the optical sheet 410. A display panel 200 region that overlaps the binding portion 443 may be the non-display area except for the display area and the pad area NA. The stopper part 443b of the binding portion 443 may have a curved shape and may increase the strength of the display device.

Referring to FIG. 6, the binding portion 443 may be disposed in the left side portion. The mold frame 300 may be coupled to the bottom chassis 440 with the tape 490 disposed therebetween. The end portion of the display panel 200 may be disposed on the panel seating part 443a of the binding portion 443 and on the optical sheet 410. The display panel 200 region that overlaps the binding portion 443 may be the non-display area except for the display area and the pad area NA. The stopper part 443b of the binding portion 443 may have a curved and may increase the strength of the display device.

Referring to FIG. 7, the binding portion 443 may be disposed in the right side portion. The mold frame 300 may be coupled to the bottom chassis 440 with the tape 490 disposed therebetween. The end portion of the display panel 200 may be disposed on the panel seating part 443a of the binding portion 443 and on the optical sheet 410. The display panel 200 region that overlaps the binding portion 443 may be part of the display area and the pad area NA. The pad area NA may be disposed on the binding portion 443 of the right side portion, and thus the panel seating part 443a may be larger in size than the left side portion or the light-facing portion.

Referring to FIGS. 4 to 7, the height of the sidewall 441 of the bottom chassis 440 may be greater than or equal to the total height of the light guide plate 420 and optical sheet 410. The light guide plate 420 and the optical sheet 410 may be disposed in the bottom chassis 440, the display panel 200 may be disposed on the binding portion 443, and a slim display device may be formed.

A display device according to an exemplary embodiment of the present inventive concept will be described with reference to FIGS. 8 to 11.

Figure 8:
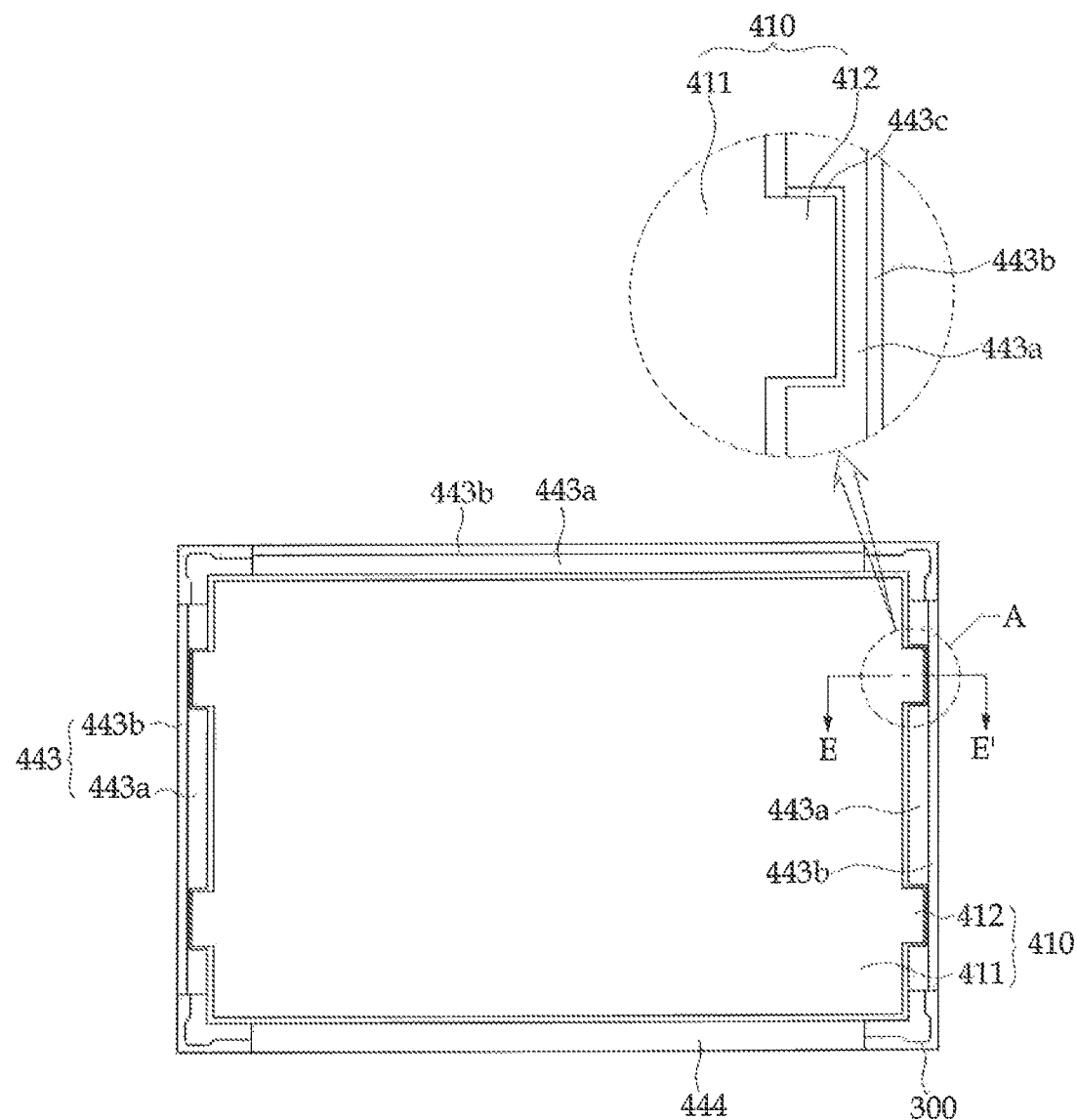
FIG. 8 is a plan view illustrating an optical sheet including a sheet guide part according to an exemplary embodiment of the present inventive concept.
Figure 9:
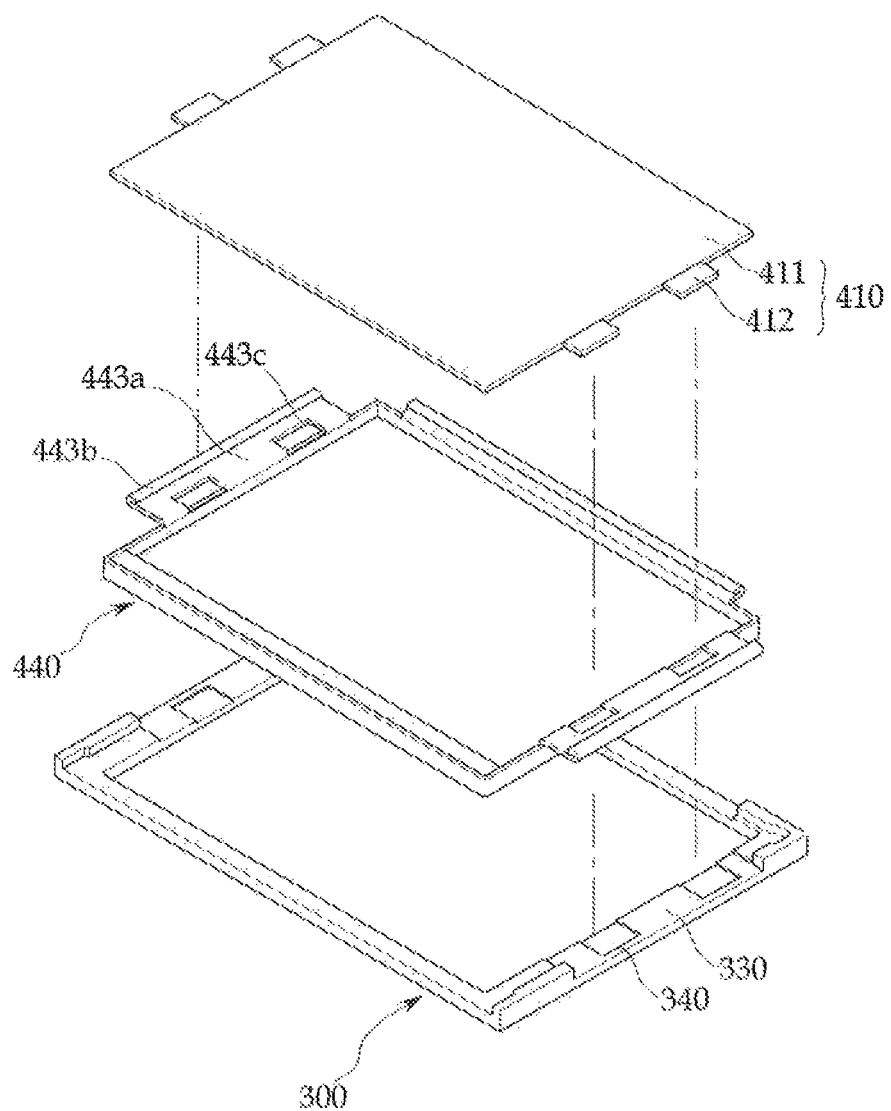
FIG. 9 is an exploded perspective view of the optical sheet illustrated in FIG. 8, a bottom chassis, and a mold frame.
Figure 10:
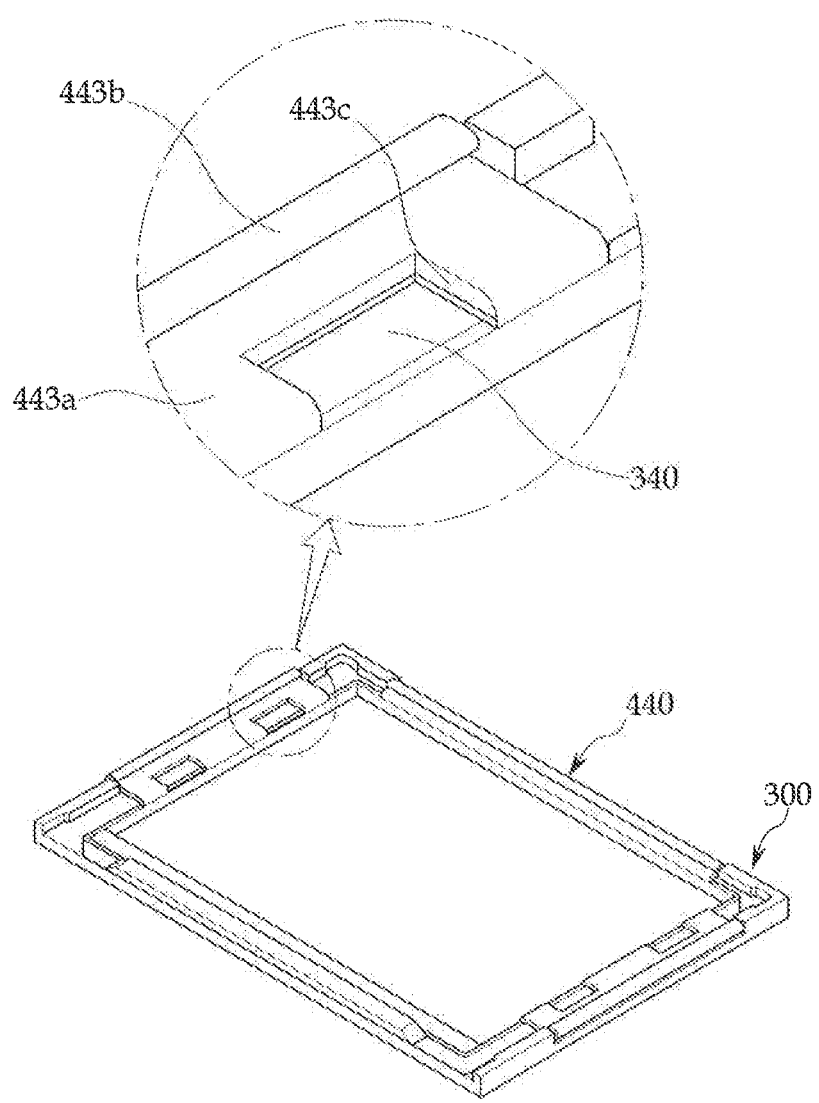
FIG. 10 is a coupled perspective view of a mold frame having an insertion groove illustrated in FIG. 8 and a bottom chassis having a guide insertion groove.
Figure 11:
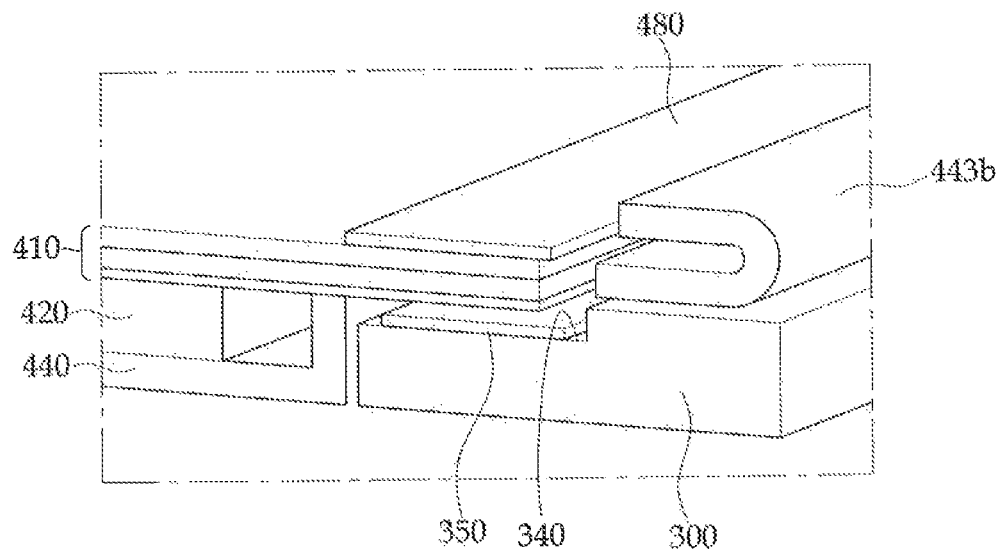
FIG. 11 is a cross-sectional view taken along line E-E' of FIG. 8.

FIG. 8 is a plan view illustrating an optical sheet including a sheet guide part according to an exemplary embodiment of the present inventive concept. FIG. 9 is an exploded perspective view of the optical sheet illustrated in FIG. 8, a bottom chassis, and a mold frame. FIG. 10 is a coupled perspective view of a mold frame having an insertion groove illustrated in FIG. 8 and a bottom chassis having a guide insertion groove. FIG. 11 is a cross-sectional view taken along line E-E' of FIG. 8.

Referring to FIGS. 8 to 11, the optical sheet 410 according to an exemplary embodiment of the present inventive concept may include a sheet body 411 and a sheet guide part 412 protruding outwards from the sheet body 411. The optical sheet 410 may be disposed in the bottom chassis 440. As illustrated in FIG. 1, the optical sheet 410 may be disposed between the bottom chassis 440 and the display panel 200.

The mold frame 300 may have an insertion groove 340 configured to accommodate the sheet guide part 412. The insertion groove 340 may be disposed in the binding groove 330 and may have a shape that corresponds to the shape of the sheet guide part 412.

The sheet guide part 412 may be disposed in the bottom chassis 440. The bottom chassis 440 may include a guide insertion groove 443c in a position corresponding to the insertion groove 340. The guide insertion groove 443c may be disposed with the sheet guide part 412 and may stably fix the sheet guide part 412.

The sheet guide part 412 may be coupled to the insertion groove 340 by the tape 350 disposed therebetween as illustrated in FIG. 11.

The sheet guide part 412 may be coupled to the bottom chassis 440 and the mold frame 300, the optical sheet 410 may be stably disposed and the strength of the display device may be increased.

Hereinafter, an exemplary embodiment of the present nventive concept will be described with reference to FIG. 12.

Figure 12:
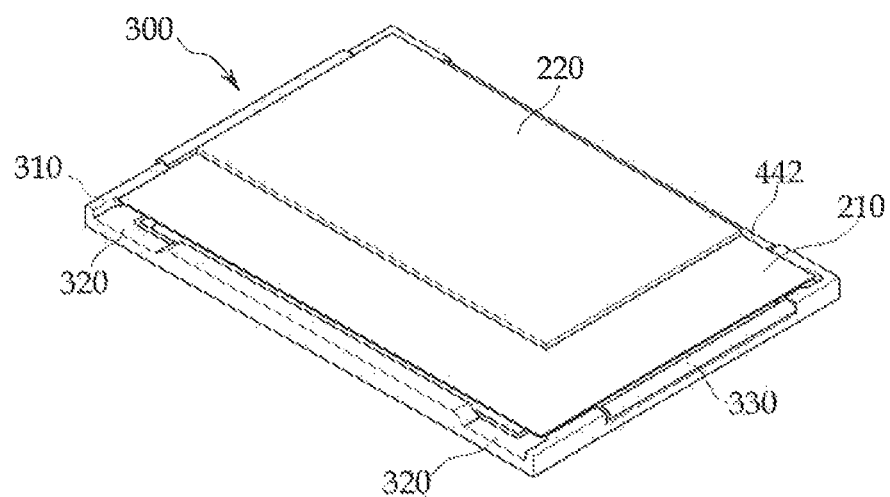
FIG. 12 is a perspective view of a mold frame according to an exemplary embodiment of the present inventive concept.

FIG. 12 is a perspective view of a mold frame according to an exemplary embodiment of the present inventive concept.

Referring to FIG. 12, the mold frame 300 need not have an opening in the sidewall part 310 as in the exemplary embodiment of the present inventive concept illustrated in FIG. 2 and may have the shape of a closed rectangle. The mold frame 300 adjacent to the sidewall 411 of a region in which the panel supporting portion 444 of the bottom chassis 440 is disposed need not be cut, and may be extended.

Hereinafter, an exemplary embodiment of the present inventive concept will be described with reference to FIG. 13.

Figure 13:
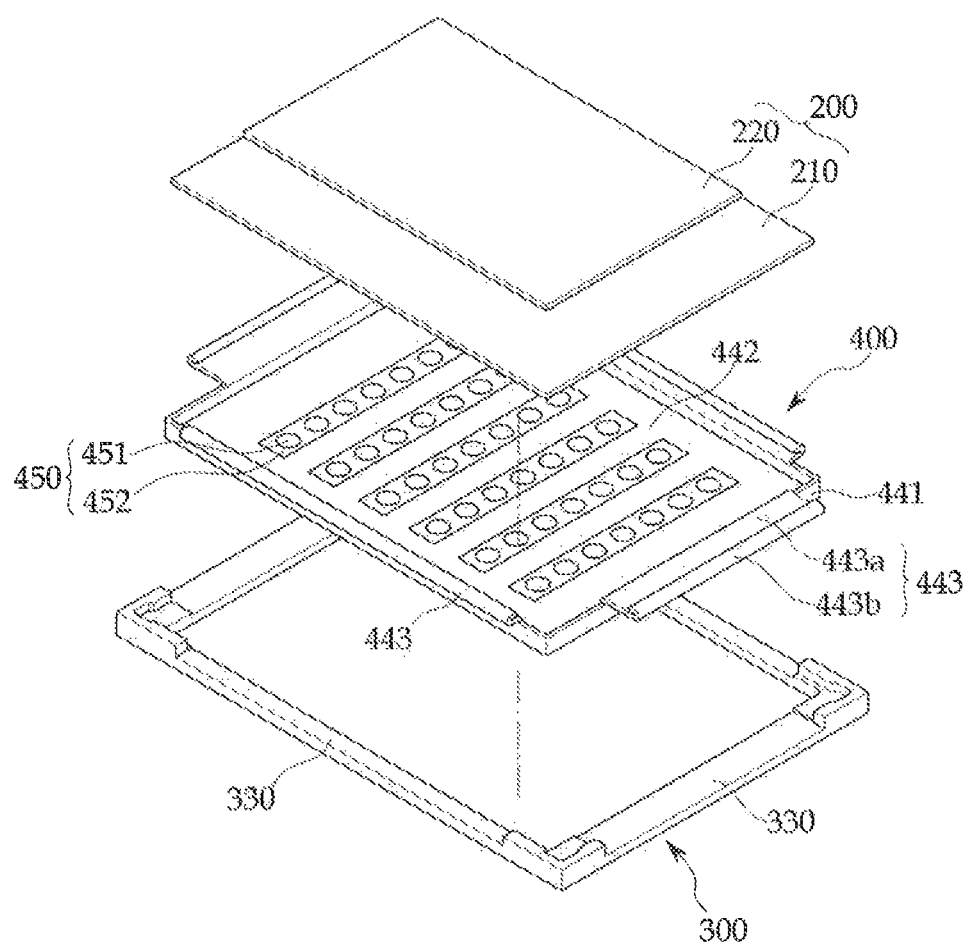
FIG. 13 is an exploded perspective view of a display device according to an exemplary embodiment of the present inventive concept.

FIG. 13 is an exploded perspective view of a display device according to an exemplary embodiment of the present inventive concept.

Referring to FIG. 13, the display device according to an exemplary embodiment of the present inventive concept may be a direct-type display device. The light source module 450 may be disposed on the base portion 442 of the bottom chassis 440.

The light source module 450 and the light sources 451 may be spaced apart from each other by a predetermined distance and luminance uniformity may be achieved. According to an exemplary embodiment of the present inventive concept, a plurality of light sources 451 may be spaced apart from each other by a uniform distance in horizontal and vertical directions and may be disposed in a matrix shape. The light sources 451 may be aligned with each other in a vertical direction and may be arranged in a zigzag pattern in a horizontal direction. The light sources 451 may be aligned with each other in a horizontal direction and may be arranged in a zigzag pattern in a vertical direction. However, exemplary embodiments of the present inventive concept are not limited thereto. The light sources 451 may be arranged in various patterns on the circuit board 452 and luminance uniformity may be achieved. A coupling opening (e.g. hole; not shown) in which a coupling member (not shown) may be disposed and fixed may be disposed in the circuit board 452.

When a direct-type backlight unit is included in the display device, a diffusion plate (not shown) may be disposed on the light source 451. A supporter (not shown) configured to support the diffusion plate may be disposed on the base portion 442 of the bottom chassis 440.

When a direct-type backlight unit is included in the display device, the binding portion 443 may be disposed on all of the four sidewalls of the bottom chassis 440 and the binding groove 330 may be formed in four edge portions of the mold frame 300. The direct-type display device may have increased strength.

The height of the sidewall 441 of the bottom chassis 440 may be greater than or equal to the total height of the diffusion plate, supporter, and optical sheet 410. The diffusion plate and the optical sheet 410 may be disposed in the bottom chassis 440 and the display panel 200 may be disposed on the binding portion 443, and a slim display device may be achieved.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:
1. A display device comprising:
 a display panel;
 a light source configured to emit light onto the display panel;
 a bottom chassis including a binding portion, wherein the bottom chassis comprises a base portion and a sidewall that extends in a direction perpendicular to a surface of the base portion, wherein the display panel and the light source are disposed on the bottom chassis, wherein the binding portion comprises a panel seating part and a stopper portion having a curved shape extending from the panel seating part, wherein the panel seating part is substantially parallel to the display panel, wherein the display panel is disposed on the panel seating part, and wherein an end surface of the curved stopper portion faces a side surface of the display panel, and wherein the binding portion is configured to substantially fix a position of the display panel; and
 a mold frame configured to substantially fix a position of the bottom chassis disposed on the mold frame, wherein the mold frame comprises a binding groove aligned with the binding portion of the bottom chassis, and wherein the mold frame has an opening in its central portion.

2. The display device of claim 1, wherein the panel seating part is disposed in the binding groove.

3. The display device of claim 1, further comprising:
 a light guide plate configured to guide light emitted from the light source therethrough; and
 an optical sheet configured to condense the light emitted from the light guide plate and transmit the condensed light to the display panel.

4. The display device of claim 3, wherein a height of the sidewall of the bottom chassis is greater than or equal to the total height of the light guide plate and the optical sheet.

5. The display device of claim 1, further comprising:
 a diffusion plate configured to diffuse the light emitted from the light source; and
 an optical sheet configured to condense the light diffused by the diffusion plate and transmit the condensed light to the display panel.

6. The display device of claim 5, further comprising a supporter configured to support the diffusion plate, wherein the supporter is disposed on the base portion of the bottom chassis.

7. The display device of claim 6, wherein a height of the sidewall of the bottom chassis is greater than or equal to the total height of the diffusion plate, the supporter, and the optical sheet.

8. The display device of claim 1, wherein the base portion and sidewall of the bottom chassis are disposed in the opening.

9. The display device of claim 1, further comprising an optical sheet disposed between the bottom chassis and the display panel, wherein the optical sheet comprises a sheet body and a sheet guide part protruding outwards from the sheet body.

10. The display device of claim 9, wherein the mold frame has an insertion groove, and wherien the sheet guide part is disposed in the insertion groove.

11. The display device of claim 10, wherein the sheet guide part is disposed in the bottom chassis, and wherein the bottom chassis comprises a guide insertion groove in a location corresponding to the insertion groove.

12. The display device of claim 1, further comprising:
a diffusion plate configured to diffuse the light emitted from the light source.

13. A display device comprising:
a display panel;
a light source configured to emit light onto the display panel;
a bottom chassis including a binding portion, wherein the display panel and the light source are disposed on the bottom chassis, and wherein the binding portion is configured to substantially fix a position of the display panel;
a mold frame configured to substantially fix a position of the bottom chassis disposed on the mold frame, wherein the mold frame comprises a binding groove aligned with the binding portion of the bottom chassis;
an optical sheet disposed between the bottom chassis and the display panel, wherein the optical sheet comprises a sheet body and a sheet guide part protruding outwards from the sheet body, wherein the mold frame has an insertion groove, and wherien the sheet guide part is disposed in the insertion groove, and wherein the sheet guide part is disposed in the bottom chassis, and wherein the bottom chassis comprises a guide insertion groove in a location corresponding to the insertion groove.

14. The display device of claim 13, wherein the bottom chassis comprises a base portion and a sidewall that extends in a direction perpendicular to a surface of the base portion.

15. The display device of claim 14, wherein the binding portion comprises:
a panel seating part that extends from the sidewall of the bottom chassis, wherein the panel seating part is substantially parallel to the base portion of the bottom chassis; and
a stopper portion extending from the panel seating part.

16. The display device of claim 15, wherein the stopper portion has a curved shape.

* * * * *